United States Patent [19]

Ishihara et al.

[11] 4,323,984
[45] Apr. 6, 1982

[54] SWITCHING EQUIPMENT USING MAGNETIC DOMAINS

[75] Inventors: Hideo Ishihara, Kamakura; Shizuo Suzuki, Yokohama; Satoru Nakabo, Tokyo, all of Japan

[73] Assignee: Kokusai Denshin Denwa Kabushiki Kaisha, Tokyo, Japan

[21] Appl. No.: 957,347

[22] Filed: Nov. 3, 1978

[30] Foreign Application Priority Data

Nov. 4, 1977 [JP] Japan .................................. 52-131488

[51] Int. Cl.$^3$ ........................ G11C 11/15; G11C 13/06
[52] U.S. Cl. ...................................... 365/10; 365/122; 365/32; 350/377; 350/34
[58] Field of Search ....................... 365/10, 32, 122; 350/151, 159, 355, 377, 407; 250/225, 578

[56] References Cited

U.S. PATENT DOCUMENTS

| | | | |
|---|---|---|---|
| 3,500,361 | 3/1970 | Cushner | 365/122 |
| 3,760,387 | 9/1973 | Chang et al. | 365/32 |
| 3,824,570 | 7/1974 | De Bot | 365/32 |
| 3,971,887 | 7/1976 | Lin | 365/32 |

OTHER PUBLICATIONS

Bell System Technical Journal–Jul.–Aug. 1973, pp. 991–1007.

*Primary Examiner*—James W. Moffitt
*Attorney, Agent, or Firm*—Robert E. Burns; Emmanuel J. Lobato; Bruce L. Adams

[57] ABSTRACT

A small, highly reliable and inexpensive switching equipment, in which digital signals to be switched, stored as the presence or absence of magnetic domains in a first magnetic sheet or applied as the presence or absence of light to a flat plane formed by bundles of optical fibers, are switched by switching condition determining signals stored as the presence or absence of magnetic domains in a second magnetic sheet.

11 Claims, 22 Drawing Figures

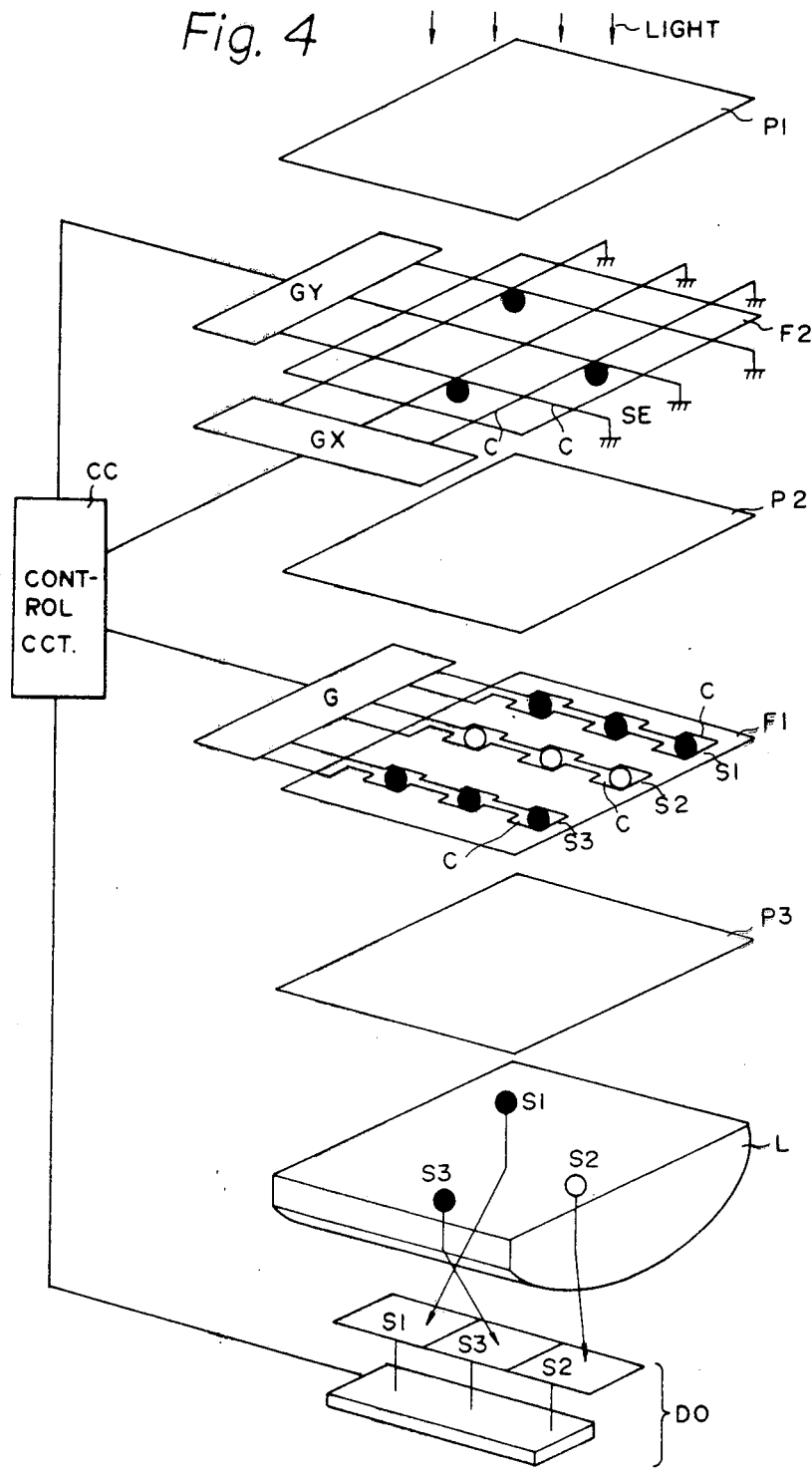

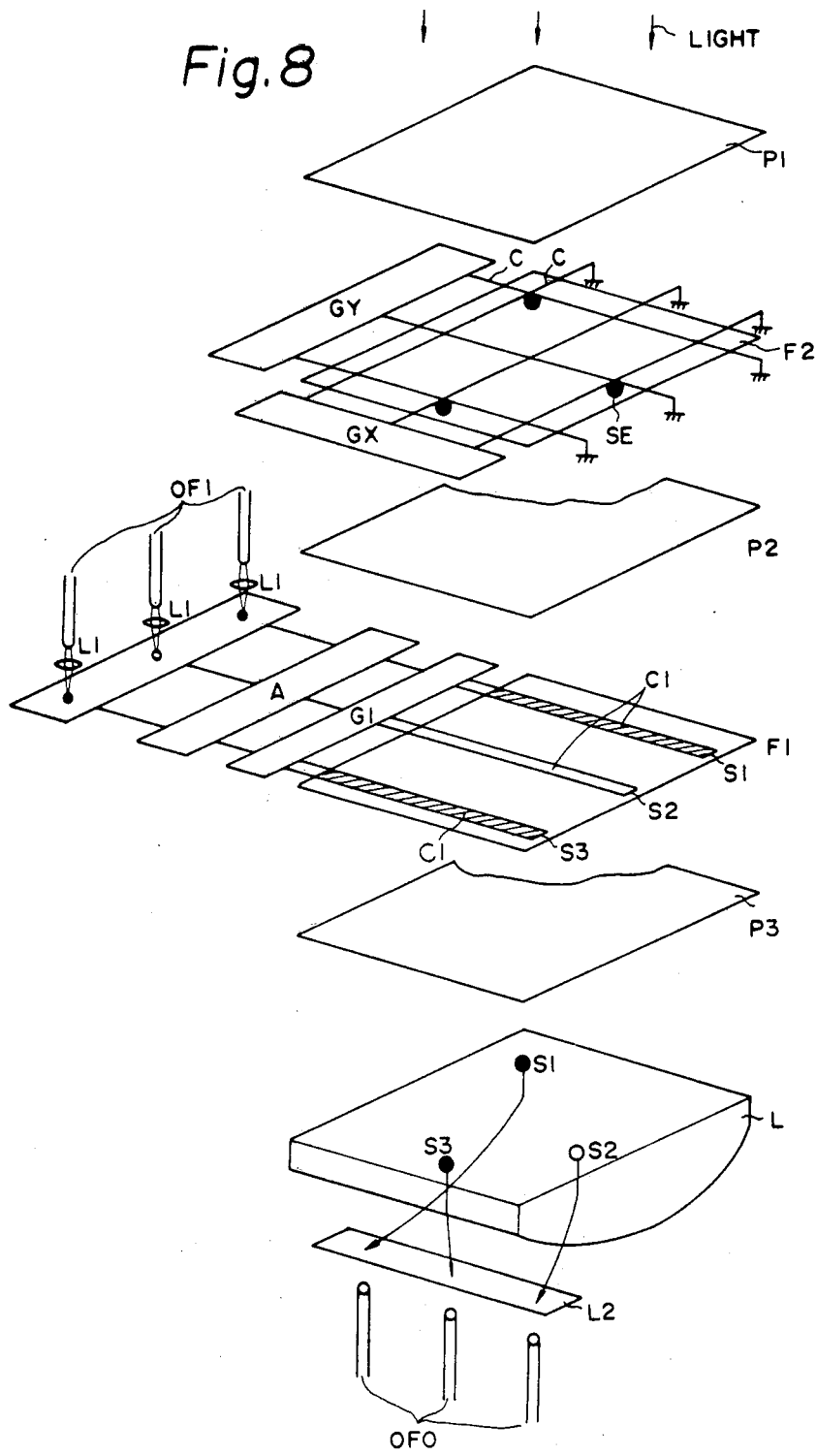

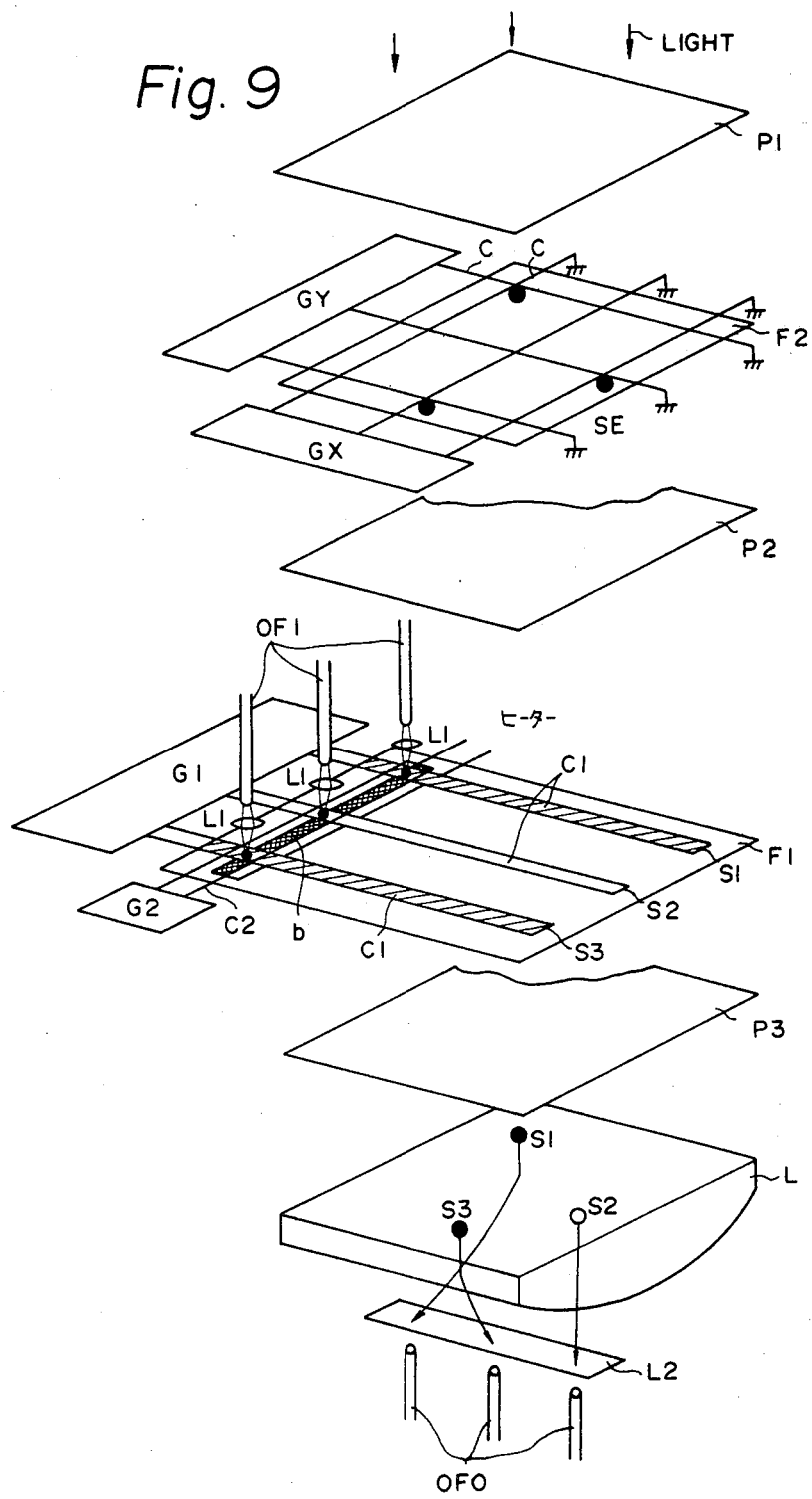

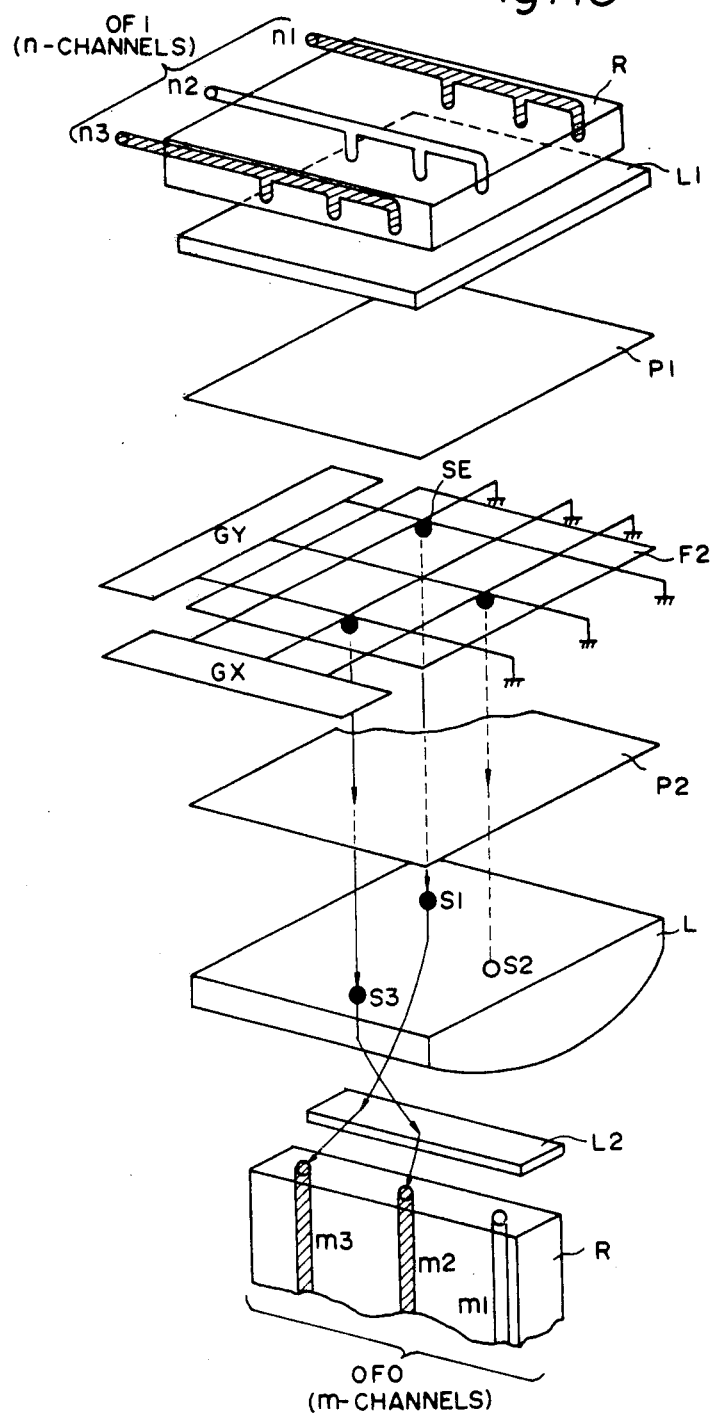

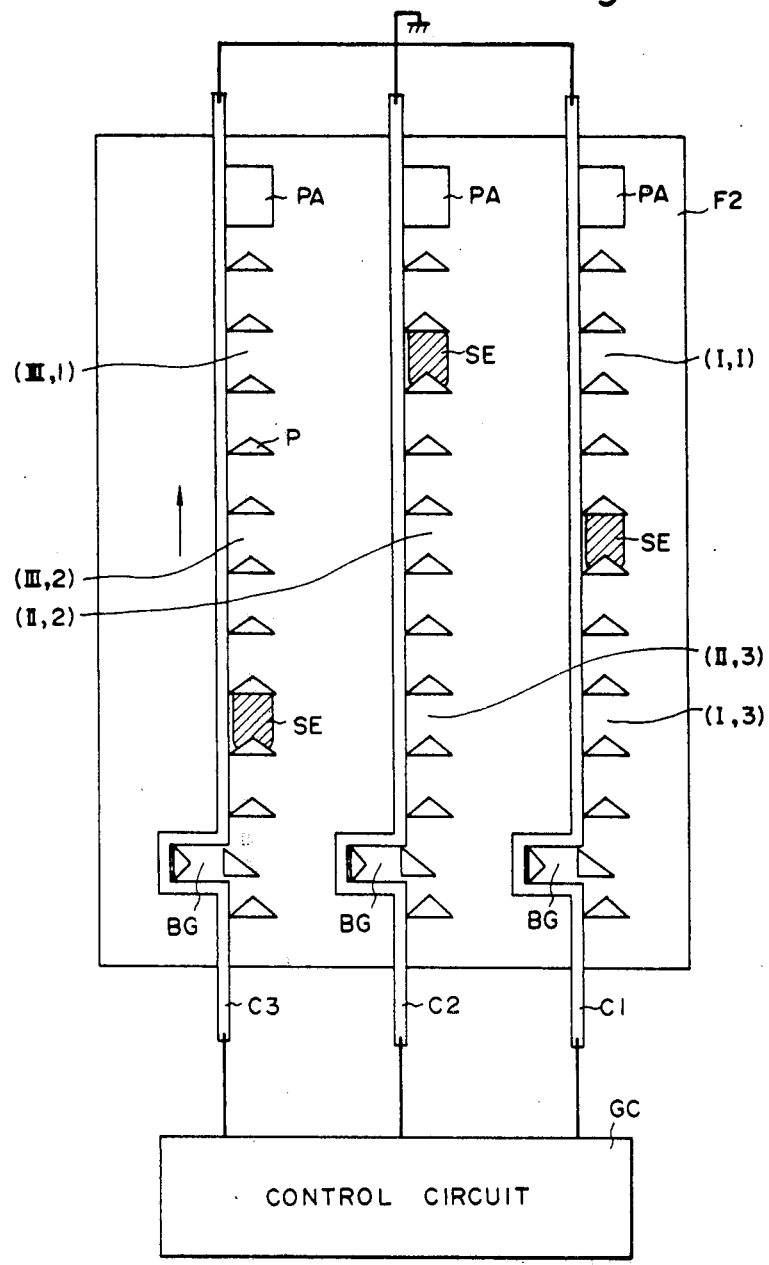

SWITCHING EQUIPMENT USING MAGNETIC DOMAINS

BACKGROUND OF THE INVENTION

1. Field Of The Invention

This invention relates to a switching equipment and, more particularly, to a switching equipment employing magnetic domains.

2. Description Of The Prior Art

Generally, switching is roughly divided into so-called channel switching which involves physical connections of circuits and time slot switching which rearranges the order of time slots in one signal frame of a PCM pulse signal or the like. The channel switching system is classified into one which employs, as a communication line switch, mechanical contacts such as reed relays or crossbar switches and one which employs electronic contacts such as transistors or diodes. The system of the type using the mechanical contacts has a problem in the reliability of the contacts and has the defects of a bulky structure and a low operating speed, whereas the system employing the semiconductor contacts has the drawbacks of expensiveness, low reliability, bulkiness because of requiring transformers on both sides of incoming and outgoing lines and presents problems in crosstalk and the low on-off ratio of the switch. For the time slot switching, it is considered possible to adopt such a method without using magnetic bubbles in which signals of one frame are stored in a memory and read out thereof in the order to time slots to be rearranged, but this method involves complicated operations for determining the reading-out order of the signals from the memory and hence requires much time. This technique is disclosed in the article: "Switching Networks of Planar Shifting Arrays," by R. S. Krupp and L. A. Tomko, The Bell System Technical Journal, July–August, 1973, pp. 991–1007. To overcome such defects, there has been proposed a method of using magnetic bubbles for the time slot switching, such as disclosed in the publication: IEEE TRANSACTIONS ON MAGNETICS, May 1977, Volume MAG-13, Number 3, pp. 969–972, but this conventional method is not suitable for a high-speed switching operation because of a low transfer speed of the magnetic bubble.

SUMMARY OF THE INVENTION

In view of the above, an object of this invention is to provide a small, highly reliable and inexpensive switching equipment, in which digital signals to be switched, stored as the presence or absence of magnetic domains in a first magnetic sheet or applied as the presence or absence of light to a flat plane formed by bundles of optical fibers, are switched by switching condition determining signals (which signals will hereinafter be referred to as the selection signals) stored as the presence or absence of magnetic domains in a second magnetic sheet.

BRIEF DESCRIPTION OF THE DRAWINGS

The principle, construction and operation of this invention will be clearly understood from the following detailed description taken in conjunction with the accompanying drawings, in which:

FIG. 4 is a perspective view illustrating an embodiment of this invention;

FIGS. 7A, 7B, 7C, 8, 9 and 10 are diagrams showing other embodiments of this invention; and FIGS. 11A, 11B, 12A, 12B and 13 are diagrams showing other examples of one part of the circuit of this invention.

DESCRIPTION OF THE PREFERED EMBODIMENTS

Figure 1:
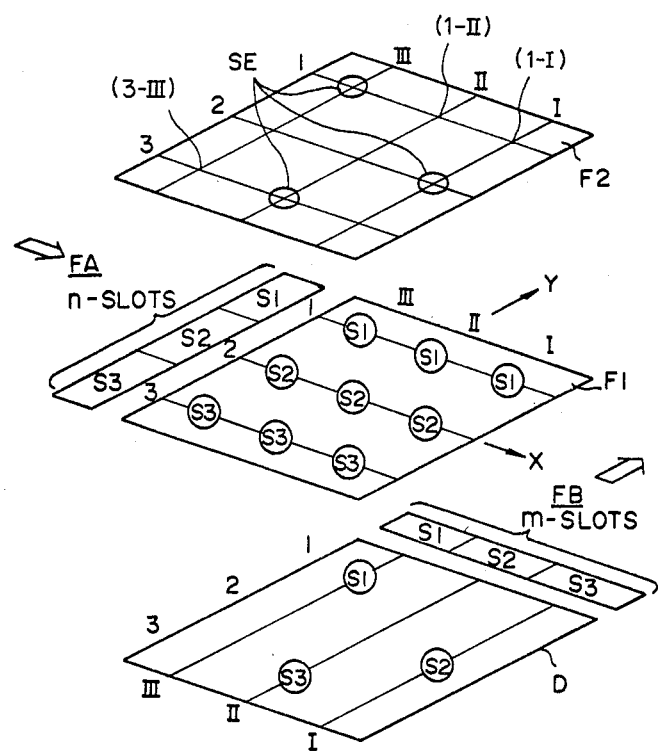
FIG. 1 is a perspective view explanatory of the principles of this invention.

FIG. 1 is a diagram explanatory of the principles of this invention and illustrates rearranging a frame FA composed of n slots to a frame FB composed of m slots (In this case, n=m=3). This method can be divided into four steps. The first step is to store time slot signals S1, S2 and S3 in a magnetic sheet F1 of a (high speed) stretcher type which will ultimately serve as an information surface. In this instance, the magnetic sheet F1 has nine signal memory positions, and the time slot signal S1 is stored in each of positions 1-I, 1-II and 1-III. Similarly, the time slot signal S2 is stored in each of positions 2-I, 2-II and 2-III, and the time slot signal S3 is also stored in each of positions 3-I, 3-II and 3-III. The second step is to store the selection signals in the form of magnetic domains SE in a magnetic sheet F2 of a (low speed) transfer type so as to select the time slot signals stored in the magnetic sheet F1. In a case where the time slot signals S1, S2 and S3 are transferred into first, third and second slots respectively, the magnetic domains SE are stored in the positions 1-III, 2-I and 3-II. This case is illustrated in FIG. 1. In the third step, under such conditions, if the magnetic domains SE serving as the selection signals could select only the time slot signals stored just under them and project the signals onto a detector D, the time slot signals S2, S3 and S1 could be obtained on the detector D at positions 2-I, 3-II and 1-III respectively, as shown in FIG. 1. Therefore, if detectors are disposed along lines I, II and III, signals S2, S3 and S1 are obtained in the order of I-II-III. Thus, the frame FB having newly rearranged slots can be formed. The last (fourth) step is an operation for processing the next frame by clearing the magnetic sheet F1 and for changing the positions of the magnetic domains SE in the magnetic sheet F2 if a condition for rearranging the time slots is altered.

A description will be given in connection with an example of a magnetic sheet suitable for the formation of a device embodying the above principles. It is known that in a rare earth orthoferrite single crystal sheet, a magnetic garnet single crystal sheet or an amorphous metal sheet (hereinafter referred to simply as the magnetic sheet) which is formed with the crystal C-axis extending perpendicular to the sheet surface, when a suitable DC magnetic field (hereinafter referred to simply as the bias magnetic field) is applied to the magnetic sheet perpendicularly to the sheet surface, there are produced magnetic domains which have magnetization opposite in direction to the bias magnetic field. It is also known that the diameter of such a magnetic domain is about 100 μm in the case of the orthoferrite material and less than 1 μm in the case of the amorphous metal sheet. These magnetic domains can be closely packed at intervals of about four times the diameter of each of the magnetic domains and can be easily generated, erased, transferred and detected, so that large capacity memories have been studied in various fields. The magnetic material which produces such a magnetic domain is transparent and has a large magneto-optic effect, and the magnetic domain can be observed with naked eyes.

Figure 2A:
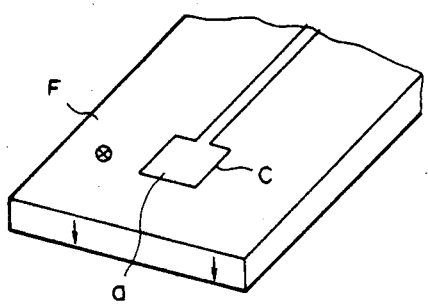
FIGS. 2A, 2B and 2C are a perspective view and schematic cross-sectional views explanatory of a manner for storing magnetic domains in a magnetic sheet.
Figure 2B:
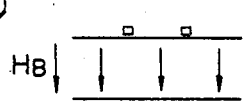
Figure 2C:
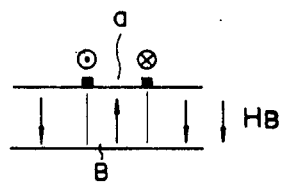

FIGS. 2A, 2B and 2C are explanatory of a method for generating a magnetic domain. With this method, a conductor C is disposed on a magnetic sheet F, as shown in FIG. 2A, and a current flows through the conductor to apply a magnetic field reverse in direction to the bias magnetic field to a region a encompassed by the conductor C, by which the magnetization of the region a is reversed to provide a magnetic domain B, as depicted in FIG. 2C. Since reverse magnetic domains are abruptly produced in the state in which no reverse magnetic domains exist as shown in FIG. 2B, this method is referred to as the magnetic domain generating method using nucleation. In this case, the magnetic domain B in FIG. 2C can be erased by applying a magnetic field reverse in direction to that applied for producing the magnetic domain.

Figure 3A:
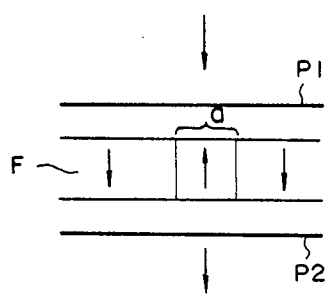
FIGS. 3A and 3B are a schematic cross-sectional view and a vector diagram explanatory of the observation of the magnetic domains in terms of a black-and-white contrast by the magneto-optic effect.
Figure 3B:
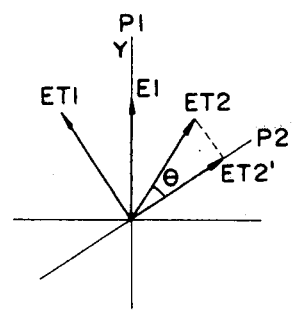

FIGS. 3A and 3B are explanatory of a method for observing a magnetic domain and determining the presence or absence of a magnetic domain in terms of a contrast between black and white by utilizing the magneto-optic effect of the magnetic material. In this method, light is injected on or incident on the magnetic sheet F held between two polarizing plates P1 and P2 as shown in FIG. 3A, so that the magnetic sheet F is observed by the transmitted light. Assuming that the light transmission axis of the polarizing plate P1 is set to the Y axis in FIG. 3B, a linearly polarized light having oscillating electric field components EI enters the magnetic sheet F uniformly over the entire area thereof. However, since the light passes through the magnetic sheet F, the plane of polarization is rotated by the Faraday effect in the magnetic sheet F. In this instance, since the direction of rotation of the plane of polarization becomes reversed in dependence on the direction of the sheet magnetization, the light having passed through the magnetic sheet F has two linearly polarized light components such as indicated by ET1 and ET2. This light then passes through the second polarizing plate P2. If the polarizing plate P2 is disposed at its light transmission axis crossing the linearly polarized light component ET1 at right angles, the polarizing plate P2 inhibits the passage therethrough of the linearly polarized light component ET1 but permits the passage therethrough of only the other linearly polarized light component ET2 as ET2'. Accordingly, it is assumed that ET2 is representative of the light having passed through the region a and ET1 is representative of the light having passed through a region other than a, and the magnetic sheet F appears bright only at the region a where the magnetic domain exists, and dark at the other remaining region.

FIG. 4 illustrates an embodiment of this invention. In the present embodiment, the magnetic sheets F2 and F1 shown in FIG. 1 are respectively sandwiched between polarizing plates P1 and P2 and between polarizing plates P2 and P3. Since the magnetic domains SE each are indicative of a selection signal, which is essential as mentioned above, select only time slot signals stored just under them to project the signals onto a detector DO, a logical AND operation by light is effected between the magnetic domains of the magnetic sheets F1 and F2. The bias magnetic field is necessary for stabilizing the magnetic domains, but it is not shown in FIG. 4 for simple illustration.

For storing the time slot signals in an information surface F1 at the first step, a current is applied by a magnetic domain generation control circuit G to the conductors C disposed on the magnetic sheet F1 to cause the reversal of magnetization by the nucleation referred to above in conjunction with FIG. 2C. In the present embodiment, the time slot signals S1, S2 and S3 assume the values of binary signals "1", "0" and "1", respectively. In the second step, the magnetic domains SE (all of which are of "1"), indicative of the selection signals, are also stored in the magnetic sheet F2 in the same manner as in the case of storing in the magnetic sheet F1. That is, currents are applied by X- and Y-direction magnetic domain generation control circuits GX and GY to the conductors C which are arranged in a matrix form on the magnetic sheet F2. However, in this case the current values are selected such that the magnetization reversal is caused only by the sum of the magnetic fields of the X- and Y-direction conductors near each intersection of the both conductors, thus achieving the magnetization reversal only at desired inter-sections of the conductors. The above control is effected by a control circuit CC.

Figure 5A:
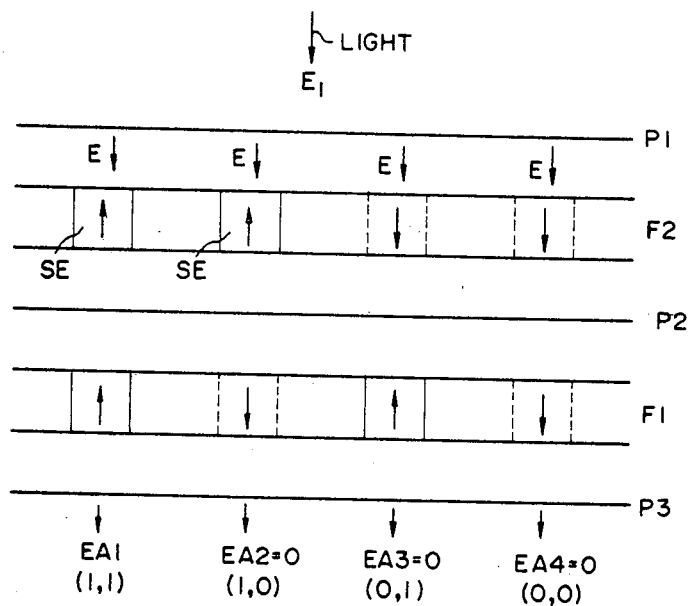
FIGS. 5A and 5B are a schematic cross-sectional view and a vector diagram explanatory of the operation of the embodiment shown in FIG. 4.
Figure 5B:
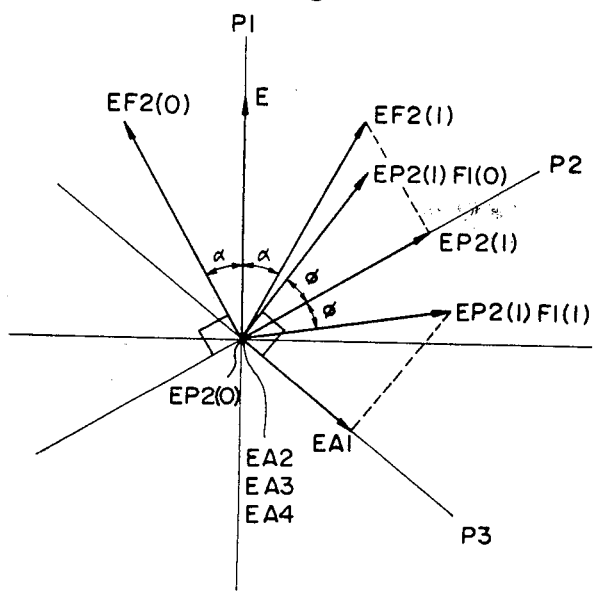

With reference to FIG. 5A, in which the two magnetic sheets F2 and F1 thus magnetized are held between the polarizing plates P1 and P2 and between P2 and P3, respectively, it will be recognized that only those of the signals stored in the magnetic sheet F1 just under the magnetic domains SE of the magnetic sheet F2 are extracted. In this instance, all the states of magnetization generated in the magnetic sheets F1 and F2 in FIG. 4 can be covered by considering four cases (1, 1), (1, 0), (0, 1) and (0, 0) shown in FIG. 5A. FIG. 5B shows in terms of electric field vectors (indicated by the arrows) what relationships an incident light E1 and transmitted lights EA1 through EA4 have in the system of FIG. 5A. The incident light E1 is converted by the polarizing plate P1 into a linearly polarized light E, which enters into the magnetic sheet F2. When the linearly polarized light E passes through the magnetic sheet F2, its plane of polarization is rotated by the magnetization vector in the magnetic sheet F2. For example, the plane of rotation of the linearly polarized light is rotated to the right or left direction in dependence upon whether the magnetization in the magnetic sheet F2 is in the state of "1" (indicating the presence of the magnetic domain SE) or "0" (indicating the absence of the magnetic domain SE). As a consequence, the linearly polarized light is caused to have electric field vectors such as indicated by EF2(1) and EF2(0). If the light transmission axis of the polarizing plate P2 is disposed at right angles to the vector EF2(0) as described previously with respect to FIG. 3B, the vectors EF2(1) and EF2(0) become EP2(1) and EP2(0) respectively, and the polarizing plate P2 permits the passage therethrough of light at a region of the magnetic sheet F2 where the magnetic domain SE exists, but completely intercepts and blocks light at a region of the magnetic sheet F2 where no magnetic domain SE exists. The light EP2(1), having passed through the magnetic sheet F2 at the region, where the magnetic domain SE exists, enters into the magnetic sheet F1 serving as an information surface. Also in this case, the plane of polarization is rotated to the right or left direction by the magnetization in the magnetic sheet F1. The light corresponding to the region of the magnetic sheet F1 which is in the state "1" becomes a vector EP2(1)F1(1), and the light corresponding to the region which is in the state "0" becomes a vector EP2(1)F1(0). If the polarizing plate P3 is disposed with its light transmission axis perpendicular to the vector EP2(1)F1(0), the light having passed through the region of the magnetic sheet F1 which is in the state "0" is intercepted by the polarizing plate P3, whereas only the light having passed through the region in the state "1" becomes a vector EA1 and passes through the polarizing plate P3. Accordingly, in this system, the state in the magnetic sheet F1 just under the region of the magnetic sheet F2 where the magnetic domain SE exists can be projected onto a suitable detection device in the form of bright and dark states respectively corresponding to the states "1" and "0". This is equivalent to the AND operation between corresponding ones of the magnetic domains in the magnetic sheets F1 and F2. Accordingly, an output is obtained only for the states (1,1) in the magnetic sheets F1 and F2 while no output is obtained for any of the other sets of states (1,0), (0,1) and (0,0). Consequently, the pair of states (1,1) can be descriminated from the other three sets of states (1,0), (0,1) and (0,0).

In the third step, the time slot signals S1, S2 and S3, each obtained as a difference in the quantities of light, are projected onto the optical detector DO through a quonset hut shaped lens L shown in FIG. 4 to provide rearranged frame signals as electric signals. Since spreading rays of light incident upon a certain region are focused in a linearly arranged fashion by the quonset hut shaped lens on a detector segment extending in a direction perpendicular to the direction of advance of the light, the time slot signals are incident upon the flat surface of the lens at places, so that the optical detector DO may be disposed straight.

The fourth step is to erase the magnetic domains in the magnetic sheets F1 and F2 after the rearrangement of one frame. To erase the magnetic domains in the magnetic sheet F1, a current of such a direction as to erase the magnetic domains is applied to the conductor C. The magnetic domains in the magnetic sheet F2 are also erased by applying to the conductors C of interest a current of such a direction as to erase the magnetic domains. The magnetic domains in both the magnetic sheets F1 and F2 can also be erased all together by intensifying the bias magnetic field. Generally, if the condition of frame exchange remains unchanged, the magnetic domains SE in the magnetic sheet F2 need not be erased and stored for each frame, and the condition of frame exchange can be stored in the magnetic sheet F2 by virture of its storage function.

The light necessary for the AND operation between the magnetic domains in the magnetic sheets F1 and F2 need not be brightened or continuously emitted during the entire exchange operation of one frame but may be brightened only during the AND operation between the magnetic domains in the magnetic sheets F1 and F2 after setting therein the magnetic domains.

Figure 6A:
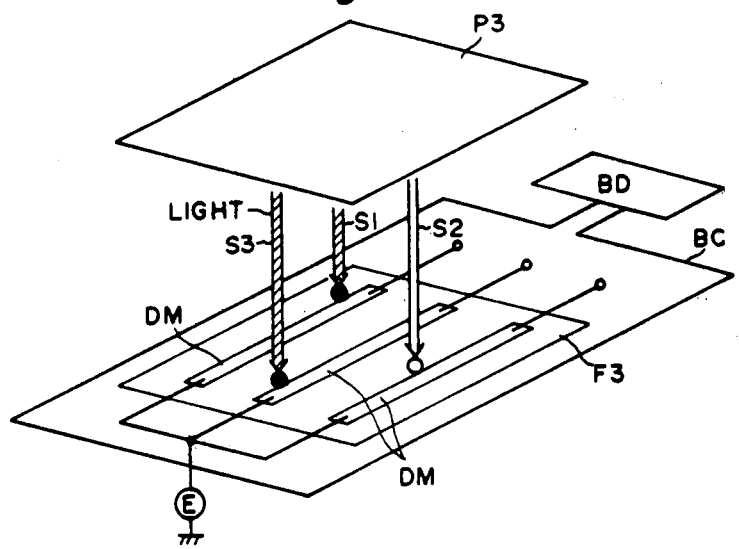
FIGS. 6A and 6B are a perspective and a plan view showing another example of a detector for use in this invention.
Figure 6B:
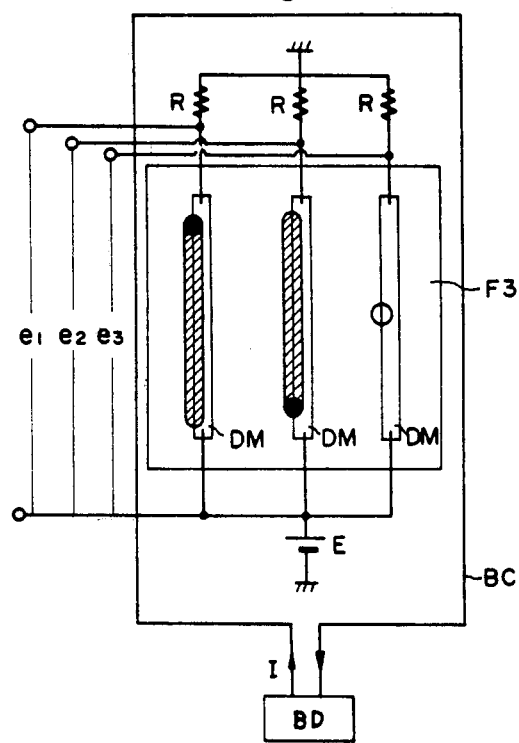

FIGS. 6A and 6B are views explanatory of the method by which the time slot signals selected by the magnetic domains SE serving as the selection signals and optically projected are converted to electric signals without using any photoelectric converters.

This method employs a third magnetic sheet F3 in place of the quonset hut shaped lens L and the optical detector DO employed in FIG. 4. In FIG. 6A, reference character DM indicate magnetic domain detectors disposed on the magnetic sheet F3; E designates a DC power source; BC identifies a coil for modulating the bias magnetic field; and BD denotes a control power source for applying a current to the coil BC. With this method, the time slot signals are stored in the magnetic sheet F3 thermo-magnetically with the light having passed through the polarizing plate P3, the magnetic domains thus stored are expanded by the manipulation of the bias magnetic field and then the presence or absence of the magnetic domains is detected by a magnetic domain detector formed by a magneto-resistance element, etc., by which the time slot signals rearranged are obtained as electric signals. According to this method, lights corresponding to the time slot signals S1 and S3 are incident upon the magnetic sheet F3 to develop therein magnetic domains, as indicated by black circles in FIG. 6A. In this instance, since no light is incident upon the region corresponding to the time slot signal S2, no magnetic domain is stored in that region. In FIG. 6A, no magnetic domain is generated in the region of the magnetic sheet F3 corresponding to the time slot signal S2, but its position is indicated by a white circle. The bias magnetic field modulating coil BC is employed for freely setting the bias magnetic field so as to facilitate the thermo-magnetic storing.

FIG. 6B is a circuit diagram explanatory of operations following the thermo-magnetic storing of the time slot signals in the magnetic sheet F3. In FIG. 6B, reference character DM indicates magnetic domain detectors, each comprising a magneto-resistance element formed by a permalloy thin film, and E designates a DC power source for applying a DC current to each magnetic domain detector DM at all times. After magnetic domains are thermo-magnetically stored in the magnetic sheet F3, a magnetic field is produced by the bias magnetic field modulating coil BC in the direction of extension of the magnetic domains in the magnetic sheet F3, causing the magnetic domains to rapidly extend along the magnetic domain detectors DM. At this time, if voltages $e_1$, $e_2$ and $e_3$ across the magnetic domain detectors DM are observed, the presence or absence of the magnetic domains can be detected because the resistance value of each magnetic domain detector DM varies in dependence on whether no magnetic domain exists in the magnetic sheet F3 or the magnetic domain extends over the entire length of the magnetic domain detector DM. As a consequence, the resistance value of the magnetic domain detector DM does not vary in the former case since the intensity of the magnetic field applied to the detector DM does not vary with time. On the other hand, the resistance value of the magnetic domain detector DM does not vary in the latter case because the intensity of the magnetic field applied to the detector DM does vary with time, because of the abrupt extension of the magnetic domain along the detector DM.

Figure 7A:
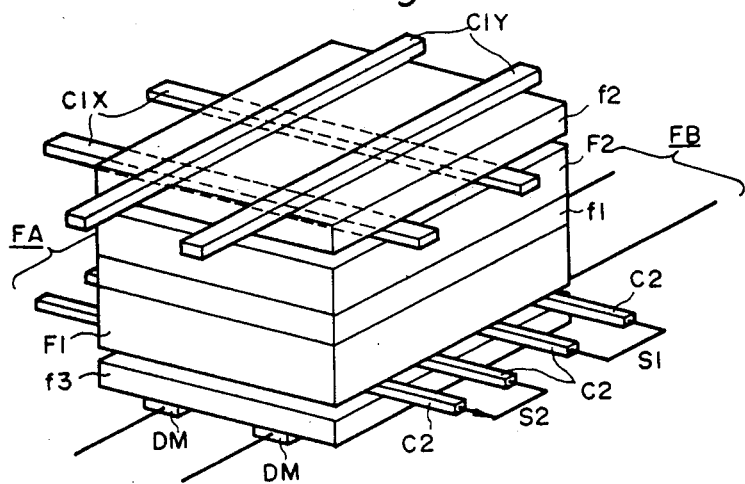
Figure 7B:
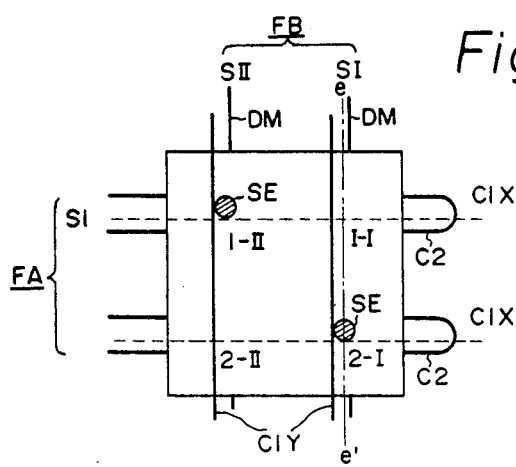
Figure 7C:
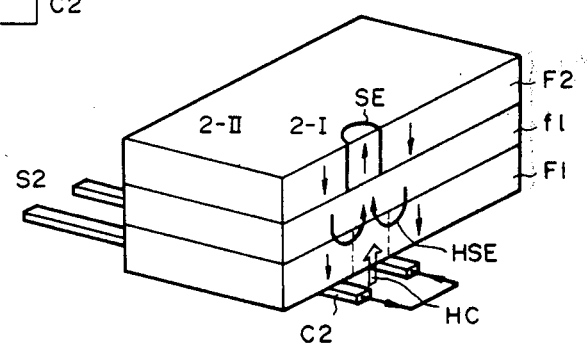

Each of the methods described above is effective to store time slot signals in the magnetic sheet F1 over the entire area thereof and to extract by light only those time slot signals underlying the magnetic domains SE in the magnetic sheet F2. Turning next to FIGS. 7A, 7B and 7C, a description will be made in connection with a method in which when the time slot signals are stored in the information surface F1, the time slot signals can be magnetically stored in the surface only just under the magnetic domains stored in the magnetic sheet F2 without using light. FIG. 7A shows a perspective view of a device in which the magnetic sheets F1 and F2 are laminated with a spacer f1 held therebetween. Reference characters C1X and C1Y indicate conductors for writing the selection signals SE into the magnetic sheet F2 for storing at desired positions; C2 designates conductors for writing time slot signals into those regions of the magnetic sheet F1 underlying the regions where the selection signals SE are stored; DM identifies magnetic domain detectors for converting the time slot signals stored in the magnetic sheet F1 to electric signals; and f3 denotes an insulation layer for insulating the magnetic domain detectors DM and the conductors C2 from each other. The present embodiment will be described with regard to a case where a frame FA of (S1:0, S2:1) is rearranged to (SI:1, SII:0). In this device, a first step is to store magnetic domains SE in the magnetic sheet F2 by the conductors C1X and C1Y in the same manner as described above in conjunction with FIG. 4. FIG. 7B is a plan view of the device shown in FIG. 7A. In FIG. 7B, the magnetic domains SE are stored in the magnetic sheet F2 at positions (1-II) and (2-I). Then, the time slot signals S1 and S2 are applied to the conductors C2 to store magnetic domains in the magnetic sheet F1. In this embodiment, the time slot signal S1 is the state "0" and the signal S2 is the state "1", so that a current i flows only in the conductor C2 corresponding to the signal S2. The current i sets up magnetic fields of the same magnitude at the positions (2-II) and (2-I) in the magnetic sheet F1, but only at the position (2-I) magnetization is reversed by the action of the magnetic domain SE in the magnetic sheet F2. FIG. 7C is a perspective view explanatory of this operation and shows in section the device of FIG. 7A along the line e—e' in FIG. 7B. The value of the current i flowing in the conductor C2 is selected so that no magnetic domain is provided in the magnetic sheet F1 only by a magnetic field HC established by the current i. The magnetic field HC is applied to the positions (2-II) and (2-I) at the same time, but since the magnetic domain SE exists in the magnetic sheet F2 at the position (2-I), a magnetic field HSE emanating from the magnetic domain SE is combined with the magnetic field HC into a composite magnetic field HC+HSE, which is applied to that position. If now the magnitude of the current i is selected such that a magnetic domain cannot be stored in the magnetic sheet F1 by the magnetic field HC only but can be stored by the composite magnetic field HC+HSE, a magnetic domain can be stored only in the position (2-I), with no magnetic domain stored in the position (2-II). After the time slot signal is thus stored in the magnetic sheet F1 only at the desired position, the magnetic domain is extended by directly applying a pulse current to each magnetic domain detector DM to convert its resistance variation to a voltage fluctuation, by which the time slot signals rearranged can be obtained as electric signals. In the case of storing the magnetic domains in the magnetic sheets F1, F2 and F3, if protons, neon or like ions are implanted into the regions in which the magnetic domains are to be stored or extended, the magnetic domains can be stored or extended with less energy.

For convenience of explanation, the above description has been given only of the case where the number of time slots is two or three and the number of bits in one time slot is one, but it is evident, of course, that this invention is not subject to any restrictions on the number of time slots handled and the number of bits in one time slot. It is also apparent that this invention is not limited specifically to the concept of time slot interchange but is applicable to the principal device for a switching equipment which generally switches n-channels to new m-channels.

Referring now to FIG. 8, a description will be made with respect to the conversion of a light signal of each optical transmission line to an electric signal by photoelectric conversion in a case of effecting channel switching between optical communication cables, each composed of optical transmission lines which are formed with many bundles of optical fibers.

A discussion will be made in respect of a method of storing the time slots signals (S1 through S3) as magnetic domains in the magnetic sheet F1 serving as an information display surface in the first step. The optical transmission lines OFI of the optical communication cable are aligned, as shown, and optical beams in the optical transmission lines are focused into enlarged or reduced images on a photoelectric converter DI by compound lenses L1 respectively disposed opposite to the optical transmission lines. Electric signals "1" and "0" converted by the photoelectric converter DI in response to the state "1" and "0" of the light signals are applied to a signal control circuit A including an amplifier (and a memory, if necessary). The signal control circuit A may be provided for each of the optical transmission lines or used in common with all of them on a time-shared basis. The electric signals from the signal control circuit A are provided to a magnetic domain generation control circuit G1. The magnetic domain generation control circuit G1 applies a current to the conductor C disposed on the magnetic sheet F1 to cause the reversal of magnetization by the nucleation described previously in connection with FIGS. 2A, 2B and 2C. In this embodiment, the time slot signals are respectively state "1", "0" and "1" in the binary representation. When a current to the conductor C from the magnetic domain generation control circuit G1 causes the reversal of magnetization in the magnetic sheet at those regions corresponding to the time slot signals having the value "1", the current may be applied to each of the conductor loops C1 at the same time or on the time-shared basis.

In the second step, the same method as described previously in conjunction with FIG. 4 is employed by which the magnetic domains SE indicative of selection signals are written and stored in the magnetic sheet F2 and the states in the regions of the magnetic sheet F1 just under those regions of the magnetic sheet F2 in which the magnetic domains SE exist are projected in the form of brightness and darkness respectively corresponding to "1" and "0".

In the third step, the time slot signals S1 through S3 obtained in the form of differences in the quantity of light are focused by a quonset hut shaped lens L into images on compound lenses L2. That is, the time slot signals are focused by the quonset hut shaped lens L on the optical transmission lines respectively corresponding to the lenses L2, thereafter being transmitted to optical transmission lines OFO for light communication. It is evident that the light incident on the polarizing plate P1 in this instance need not be continuous but may be applied in the pulse-like manner after completion of the first step. The alternative to the method of storing the time slot signals as magnetic domains in the magnetic sheet F1 by the light signals of the optical transmission lines for light communication is to store the time slot signals thermo-magnetically. With reference to FIG. 9, a description will hereinbelow be given of an example of the circuit switching by the method of thermo-magnetically storing the light signal of each optical transmission line in the form of a magnetic domain. This method is of particular utility when employed in a case where the light signal level of the optical transmission line is relatively high (about 100 $\mu$w).

The optical transmission lines OFI of the optical communication cable are arranged in a line, as shown in FIG. 9. The light beams of the optical transmission lines are focused into enlarged or reduced images by the compound lenses L1 respectively disposed opposite to the optical transmission lines. The magnetic sheet F1 is heated by light only at the regions corresponding to those of the light signals which are "1". In this case, a bias is applied as heat to the magnetic sheet F1 by a heater, as shown, to heat only that limited region b (the close-meshed region in FIG. 9) of the magnetic sheet F1 which underlies the optical transmission lines, and at the same time, a current is applied by a reverse bias magnetic field generator G2 to a conductor loop C2 to reduce the bias magnetic field only in the region b to facilitate the thermo-magnetic writing, and then magnetic domains are thermo-magnetically stored in the magnetic sheet F1 only at the positions corresponding to those of the optical transmission lines over which the light signals "1" have been transmitted. Next, after cutting off the heating current from the heater and the current to the conductor loop C2, a current is applied by the magnetic domain generation control circuit G1 to each of the conductor loops C1 to decrease the bias magnetic field only in the regions encompassed by the conductor loops C1. As a result of this, the magnetic domains thermo-magnetically stored in the inside regions of the conductor loops C1 spread in the encompassed regions, thus the time slot signals S1 through S3 are stored. In this example, the time slot signals S1, S2 and S2 are respectively states "1", "0" and "1" in the binary representation. It is apparent that the subsequent steps are carried out by the same manner as described previously and that in the third step the light signal can be transmitted to the optical communication cable of the next stage.

In this case, the light supplied to the output optical transmission line OFO is not the light itself of the input optical transmission line, so that if the intensity of light LI for input to the output optical transmission line OFO in accordance with the magnetic domain SE is raised to a level higher than the intensity of light of the optical transmission line OFI, it means that the light for input to the optical transmission line OFO is amplified equivalently. It will be seen that the embodiment of FIG. 9 performs the function of light-reproducing switching. Further, it is evident that this invention can be applied to a time slot interchange device by providing means for distributing the time slot signals of one frame applied in a time sequence to the input optical transmission lines respectively.

Moreover, by a suitable selection of the structure of the optical transmission line OFI for the input signal supply, a simpler optical circuit switching equipment can be obtained. FIG. 10 illustrates another embodiment of the optical circuit switching equipment. In FIG. 10, n-channel optical transmission lines are each branched to m channels and molded by a suitable material R and designed to produce light signals in all of the m channels at the same time. This example shows a case where n=m=3. FIG. 10 shows a moment when signals of one clock pulse of a PCM pulse signal are derived from the optical transmission lines. Channels n1 and n3 are "1" and n2 is "0", and the optical transmission lines from which lights are being derived are indicated by hatched lines. The diameters of luminous fluxes of these lights are enlarged or reduced by the lens L1, and then the lights are incident upon the polarizer P1 to be converted to linearly polarized lights, which are directed to the intersections of conductors arranged in a matrix form on the magnetic sheet F2. The subsequent operations are the same as those described above with respect to FIGS. 4 and 8. Only the lights applied to the intersections of the conductors at which magnetic domains SE exist are permitted to pass through the polarizer P2 and then applied to the output optical transmission lines OFO via the quonset hut shaped lens L and an enlarging-reducing (reducing in this example) lens L2, thus completing the circuit switching operation. In this instance, an AND operation is effected between the light from the optical transmission line OFI and the magnetic domain SE. It is apparent that this example can also be employed as a time slot interchange device by providing means for distributing the time slot signals of one time frame inputted in a time sequence to each of the optical transmission lines shown. The optical transmission line group used in this example can be replaced by a luminescent diode or a laser diode array.

The foregoing embodiments all employ the nucleation method in which magnetic domains are produced in the state of no magnetic domain being present to store signals in the magnetic sheets F1 and F2, but it is also possible to use such a method in which seed magnetic domains are prepared beforehand in the magnetic sheets F1 and F2 and extended by a conductor current. FIGS. 11A, 11B, 12A and 12B are plan views explanatory of this method.

Figure 11A:
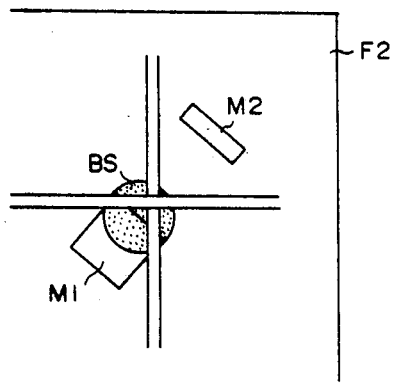
Figure 11B:
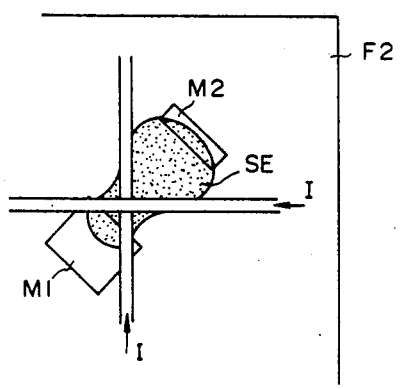

FIGS. 11A and 11B are views explanatory of a manner of storing a magnetic domain SE in the magnetic sheet F2. With this method, soft magnetic thin films M1 and M2 of material such as permalloy are disposed near the intersections of conductors on the magnetic sheet F2 to generate a seed magnetic domain BS in advance. For storing the selection signal SE in such a state, a current I is applied to the two conductors to extend the seed magnetic domain BS so that it is captured by the soft magnetic thin film M2. In this case, by suitably selecting the size and thickness of the soft magnetic thin film M1, the seed magnetic domain BS remains also captured by the soft magnetic thin film M1, so that the magnetic domain SE can be erased by reversing the current direction to provide again the state of FIG. 11A.

Figure 12A:
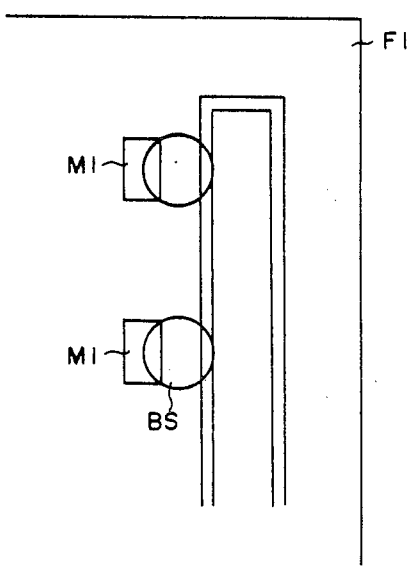
Figure 12B:
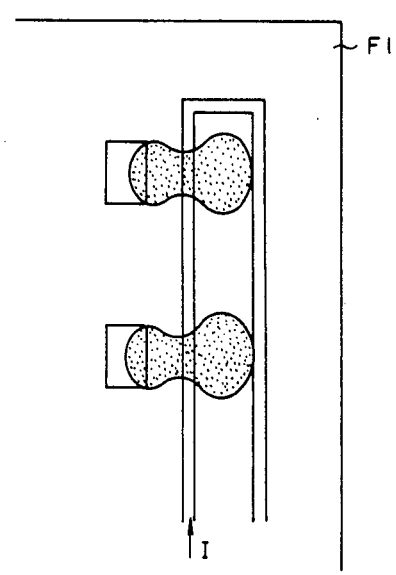

FIGS. 12A and 12 are views explanatory of a manner of storing time slot signals in the magnetic sheet F1. Also in this case, the seed magnetic domains BS are seized by the soft magnetic thin films M1, and in the case of storing a signal, the current I is applied to the conductor to cause the seed magnetic domains BS to extend, as shown in FIG. 12B. In this instance, the state of FIG. 12A can be restored only by cutting off the current I.

For storing the magnetic domains SE indicative of the selection signals in the magnetic sheets F2, the foregoing embodiments all employ a method in which currents are applied to the X- and Y-direction conductors to generate magnetic domains at the intersections of the conductors by nucleation. However, the magnetic domains can also be set up by a manner in which the magnetic sheet F2 is made of a bubble magnetic substance and magnetic bubbles produced therein at certain places are transferred to predetermined places. FIG. 13 is explanatory of another example in which the magnetic domains SE are arranged at desired positions. Reference character F2 indicates a sheet of, for example, orthoferrite or magnetic garnet and capable of generating, transferring and erasing magnetic bubbles. Reference character C designates conductors; P and PA identify permalloy thin films closely disposed on the sheet F2; and GC denotes a control circuit. The circuit in which anglefish-shaped permalloy thin films are disposed along the conductors C is a bubble transfer circuit which is known under the name of "Single Conductor and Ratch" (reference literature, IEEE Transaction on Magnetics, MAG-10, No. 3, pp. 844–847) and in which the magnetic bubble can be shifted in the direction of the arrow by steps corresponding to the number of current pulses applied to the conductor C. In this circuit, pulse currents are applied to the conductors C1, C2 and C3 to produce magnetic bubbles in regions BG by nucleation. Then, the currents to the conductors are set at a level smaller than those for the magnetic bubble generation, and pulses corresponding in number to the position of each magnetic domain SE being set are applied to each of the conductors C1, C2 and C3 to shift forward the magnetic bubble to the desired position. In case of changing the set position, a pulse current is applied to, for example, the conductor C1 to absorb the magnetic bubble into the permalloy thin film PA to clear the magnetic bubble path and then a magnetic bubble is newly generated in the region BG and set at a desired position.

As has been described above in detail, this invention makes use of physical properties of the magnetic domains in a magnetic sheet and provides a circuit or time slot switching equipment which includes no mechanical moving parts and in which both of circuit or time slot signals to be switched and the selection signals indicative of the switching condition are stored in the form of the presence or absence of magnetic domains in the magnetic sheet, or either the circuit or time slot signals or the selection signals are represented in the form of an optical transmission line matrix, thereby enabling AND operations between the channel or time slot signals and the selection signals simultaneously in the magnetic sheet to effect channel switching or time slot switching at high speed. Accordingly, this invention is highly valuable from the industrial point of view.

What we claim is:

1. A switching equipment using magnetic domains, comprising:

a magnetic sheet having the property of producing magnetic domains respectively at a plurality of storage positions arranged in a matrix form, first input control means responsive to selection signals for setting the magnetic domains at the plurality of storage positions on the magnetic sheet to either one of two states in accordance with the states of a plurality of selection signals, means defining an information surface in registration with said magnetic sheet and capable of indicating binary information at each of a plurality of indication positions arranged in a matrix respectively corresponding to the plurality of storage positions of the matrix of said magnetic sheet, second input control means responsive to input signals for setting the state of the binary information of each of the plurality of indication positions along respective rows or columns of the matrix of the information surface to the same signal state as one another and to the states of respective ones of the input signals, and output means for obtaining a plurality of logical products of corresponding ones of the magnetic domains at the plurality of storage positions on the magnetic sheet and the binary information at the plurality of indication positions on the information surface to derive the logical products as one dimensional information, the input signals being exchanged in accordance with the states of the selection signals and provided as the one dimensional information.

2. A switching equipment using magnetic domains according to claim 1, wherein the first input control means has structure for current coincidence control by drive lines arranged in a matrix form.

3. A switching equipment using magnetic domains according to claim 2, wherein the first input control means includes; means for generating a required number of magnetic domains, and means for transferring the magnetic domains generated.

4. A switching equipment using magnetic domains according to claim 1, wherein the information surface is constructed so as to be indicated in terms of the binary conditions of the magnetic domains in the magnetic sheet.

5. A switching equipment using magnetic domains according to claim 4, wherein the second input control means is constructed so that the magnetic domains are stored in the information surface by the logical products of magnetic fields set up by applying the input signals to required ones of conductors and magnetic fields induced from the magnetic domains in the magnetic sheet.

6. A switching equipment using magnetic domains according to claim 4, wherein the second input control means is constructed so that the input signals applied as light signals are converted to electric signals and then applied to required ones of conductors to magnetically store the magnetic domains in the information surface.

7. A switching equipment using magnetic domains according to claim 4, wherein the second input control means is constructed so that the input signals applied as light signals are thermomagnetically stored as the magnetic domains in the information surface.

8. A switching equipment using magnetic domains according to claim 1, wherein the information surface has disposed thereon a plurality of optical transmission lines in a matrix form and is constructed so that the presence or absence of the light outputs from the optical transmission lines corresponds to binary information.

9. A switching equipment using magnetic domains according to claim 1, wherein the output means is constructed so that information read out in the form of magnetic domains by the logical products of the magnetic fields set up by the required conductors and the magnetic domains in the magnetic sheet is provided as the one dimensional information by utilizing the magnetoresistance effect.

10. A switching equipment using magnetic domains according to claim 1, wherein the output means has a plurality of polarizing plates disposed so that when a polarized light incident upon the magnetic sheet and the information surface passes therethrough, polarized output lights corresponding to one of the two states of the magnetic domains is blocked and polarized output lights corresponding to the other state is taken out to obtain the logical products, and a lens system positioned so that these output lights are converted by the lens system to the one dimensional information.

11. A switching equipment using magnetic domains according to claim 1, wherein the output means has a plurality of polarizing plates disposed so that when the output light from the information surface passes through the magnetic sheet, light outputs corresponding to one of the two states of the magnetic domains are intercepted and light outputs corresponding to the other state are taken out to obtain the logical products, these output lights being converted by a lens system to the one dimensional information.

* * * * *